United States Patent
Wang et al.

(10) Patent No.: US 10,957,521 B2
(45) Date of Patent: Mar. 23, 2021

(54) IMAGE BASED PLASMA SHEATH PROFILE DETECTION ON PLASMA PROCESSING TOOLS

(71) Applicant: LAM RESEARCH CORPORATION, Fremont, CA (US)

(72) Inventors: Yuhou Wang, Fremont, CA (US); Michael John Martin, Los Angeles, CA (US); Jon Mcchesney, Fremont, CA (US); Alexander Miller Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 204 days.

(21) Appl. No.: 15/991,021

(22) Filed: May 29, 2018

(65) Prior Publication Data
US 2019/0371581 A1   Dec. 5, 2019

(51) Int. Cl.
  *H01J 37/32* (2006.01)
  *G06T 7/00* (2017.01)
  *H01L 21/66* (2006.01)

(52) U.S. Cl.
  CPC ........ *H01J 37/32981* (2013.01); *G06T 7/001* (2013.01); *H01J 37/32091* (2013.01); *H01J 37/32458* (2013.01); *H01J 37/32715* (2013.01); *H01J 37/32926* (2013.01); *G06T 2207/30148* (2013.01); *H01J 37/32917* (2013.01); *H01L 22/26* (2013.01)

(58) Field of Classification Search
  USPC ................................................. 118/715–733
  See application file for complete search history.

(56) References Cited

U.S. PATENT DOCUMENTS

| | | | |
|---|---|---|---|
| 9,947,517 B1 | 4/2018 | Luere et al. | |
| 2007/0224709 A1* | 9/2007 | Ogasawara | H01J 37/32642 438/5 |
| 2008/0253377 A1* | 10/2008 | Chung | H01J 37/32935 370/395.3 |
| 2010/0024723 A1* | 2/2010 | Hasegawa | H01L 21/68 118/500 |
| 2015/0235381 A1 | 8/2015 | Kim | |
| 2017/0032987 A1* | 2/2017 | Lee | H01L 21/68735 |
| 2017/0047202 A1 | 2/2017 | Kumar | |

(Continued)

FOREIGN PATENT DOCUMENTS

JP   63177415   * 7/1988

OTHER PUBLICATIONS

JP63177415, Mutsukura et al (Year: 1988).*

(Continued)

*Primary Examiner* — Rakesh L Dhingra

(57) ABSTRACT

A system includes an image processing module configured to receive an image, captured by an imaging device, of a plasma environment within a substrate processing chamber during processing of a substrate and extract one or more features of the image indicative of a plasma sheath formed within the plasma environment during the processing of the substrate. A control module is configured to determine a plasma sheath profile based on the one or more features extracted from the image and selectively adjust at least one processing parameter related to the processing of the substrate based on the plasma sheath profile.

10 Claims, 5 Drawing Sheets

(56) References Cited

U.S. PATENT DOCUMENTS

2017/0213758 A1* 7/2017 Rice ................. H01J 37/32091
2018/0040460 A1    2/2018 Gottscho
2018/0204750 A1* 7/2018 Bhatia ................ H01L 21/3065
2019/0318918 A1* 10/2019 Saitoh ................ H01J 37/3244

OTHER PUBLICATIONS

International Search Report and Written Opinion dated Sep. 25, 2019 Corresponding to Application No. PCT/US2019/033693, 10 pages.

* cited by examiner

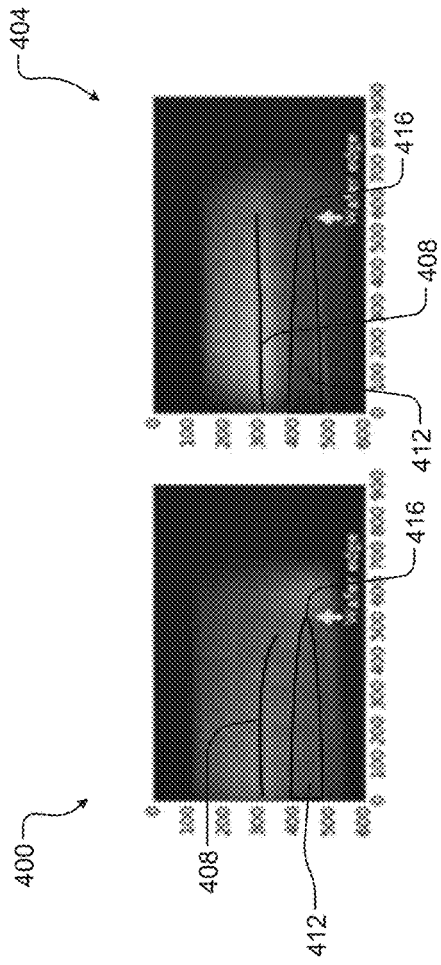 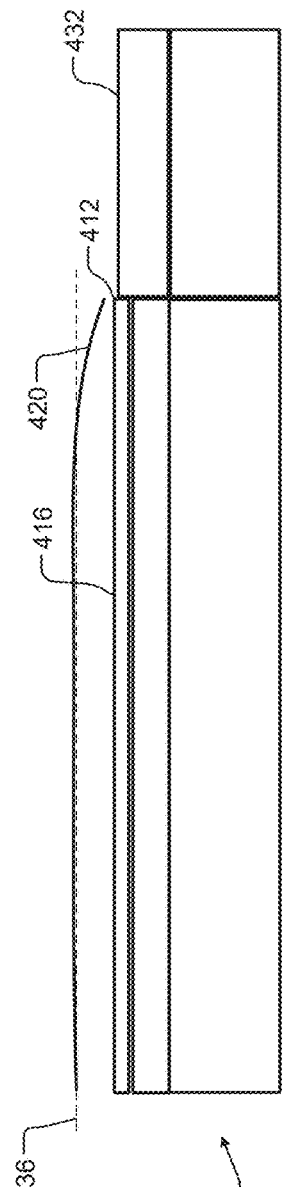 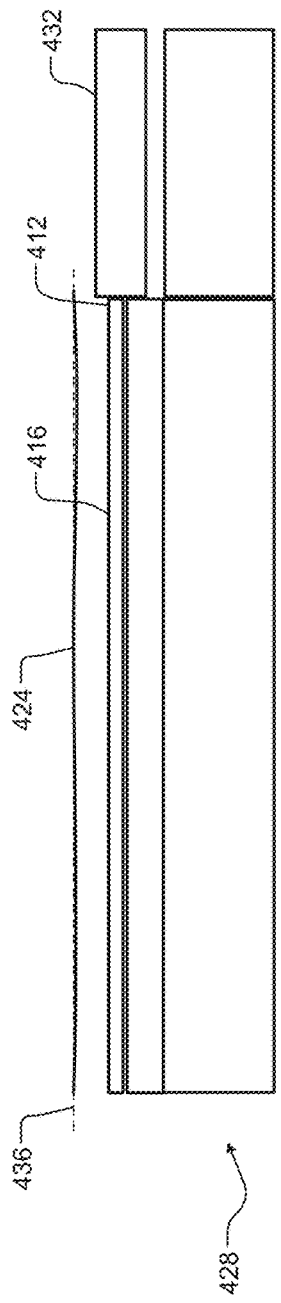
FIG. 4A
FIG. 4B
FIG. 4C

IMAGE BASED PLASMA SHEATH PROFILE DETECTION ON PLASMA PROCESSING TOOLS

FIELD

The present disclosure relates to substrate processing, and more particularly to detecting and monitoring a plasma sheath profile within a substrate processing chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures may be introduced into the processing chamber and plasma may be used to initiate chemical reactions.

During processing of a substrate using plasma, a plasma boundary layer (referred to as a plasma sheath) is formed above a surface of the substrate. Plasma sheath thickness depends on various factors including, but not limited to, plasma density, electron temperature, driving voltage, etc. For example only, plasma sheath thickness may vary from a fraction of 1 mm to a few millimeters.

SUMMARY

A system includes an image processing module configured to receive an image, captured by an imagine device, of a plasma environment within a substrate processing chamber during processing of a substrate and extract one or more features of the image indicative of a plasma sheath formed within the plasma environment during the processing of the substrate. A control module is configured to determine a plasma sheath profile based on the one or more features extracted from the image and selectively adjust at least one processing parameter related to the processing of the substrate based on the plasma sheath profile.

In other features, the extracted one or more features correspond to a contrast between a bulk plasma region and a plasma sheath region. The extracted one or more features correspond to a line between the bulk plasma region and the plasma sheath region. The control module is configured to compare the plasma sheath profile to a reference profile and selectively adjust the at least one processing parameter based on a difference between the plasma sheath profile and the reference profile. The control module is configured to compare the plasma sheath profile to a reference line and selectively adjust the at least one processing parameter based on a difference between the plasma sheath profile and the reference line. The control module is configured to determine a flatness of the plasma sheath profile to selectively adjust the at least one processing parameter.

In other features, the at least one processing parameter corresponds to a height of an edge ring and the control module is configured to adjust the height of the edge ring based on the one or more features extracted from the image. The at least one processing parameter corresponds to power provided to an edge ring and the control module is configured to adjust the power provided to the edge ring based on the one or more features extracted from the image. The system further includes the imaging device and the imagine device is arranged to view the plasma environment above an edge region of the substrate through an opening in a sidewall of the substrate processing chamber. The system further includes a shutter arranged to selectively open and close within the opening in the sidewall of the substrate processing chamber. The control module is configured to selectively open and close the shutter to allow the imagine device to capture the image.

A method includes capturing an image of a plasma environment within a substrate processing chamber during processing of a substrate, extracting one or more features of the image indicative of a plasma sheath formed within the plasma environment during the processing of the substrate, determining a plasma sheath profile based on the one or more features extracted from the image, and selectively adjusting at least one processing parameter related to the processing of the substrate based on the plasma sheath profile.

In other features, the extracted one or more features correspond to a contrast between a bulk plasma region and a plasma sheath region. The extracted one or more features correspond to a line between the bulk plasma region and the plasma sheath region. Selectively adjusting the at least one processing parameter includes comparing the plasma sheath profile to a reference profile and selectively adjusting the at least one processing parameter based on a difference between the plasma sheath profile and the reference profile. Selectively adjusting the at least one processing parameter includes comparing the plasma sheath profile to a reference line and selectively adjusting the at least one processing parameter based on a difference between the plasma sheath profile and the reference line. Selectively adjusting the at least one processing parameter includes determining a flatness of the plasma sheath profile.

In other features, the at least one processing parameter corresponds to a height of an edge ring and selectively adjusting the at least one processing parameter includes adjusting the height of the edge ring based on the one or more features extracted from the image. The at least one processing parameter corresponds to power provided to an edge ring and selectively adjusting the at least one processing parameter includes adjusting the power provided to the edge ring based on the one or more features extracted from the image. The method further includes selectively opening and closing a shutter within an opening in a sidewall of the substrate processing chamber to allow an imagine device to capture the image.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4A shows example images of a plasma sheath profile according to the present disclosure;

FIG. 4B shows an example feature of a plasma sheath profile according to the present disclosure;

FIG. 4C shows another example feature of a plasma sheath profile according to the present disclosure.

In the drawings, reference numbers may be reused to identify similar and/or identical elements.

DETAILED DESCRIPTION

Results of processing substrates using plasma are dependent upon a plasma sheath profile (e.g., a thickness of the plasma sheath across a surface of the substrate). For example, in plasma etching processes, the plasma sheath profile may affect etch rates. Accordingly, process uniformity is dependent upon a flatness of the plasma sheath. In other words, a uniform plasma sheath thickness is desirable to minimize process non-uniformity.

In some examples, the plasma sheath profile may be estimated subsequent to processing. For example, each completed substrate may be examined subsequent to substrate processing to determine etch uniformity, tilting, etc. Various adjustments may then be made on a feedforward basis to processing and/or processing chamber parameters to attempt to adjust the plasma sheath profile for the next round of substrate processing. However, estimating and compensating for plasma sheath profile non-uniformity in this manner may increase cost and decrease processing efficiency and throughput.

Plasma sheath profile systems and methods according to the principles of the present disclosure determine the plasma sheath profile during processing of a substrate and facilitate control of the plasma sheath profile accordingly. For example, an imaging device such as a camera is arranged to image and monitor the plasma sheath within the processing chamber. The camera may be located external to the processing chamber and arranged to view the plasma sheath through a window in a sidewall of the processing chamber. The plasma sheath profile may be determined and, in some examples, controlled in accordance with images captured by the camera during processing. In this manner, processing non-uniformities associated with the plasma sheath profile are minimized and processing costs and time are reduced.

In some examples, a substrate support in a substrate processing system may include a moveable and/or powered edge ring. Some aspects of substrate processing (e.g., the plasma sheath profile, process gas flow patterns, etc.) affecting etch rate and etch uniformity may vary according to a height of the edge ring. For example, overall etch rates vary as a distance between an upper surface of the substrate and a bottom surface of a gas distribution device increases. Further, the etch rates may vary from the center of the substrate to an outer perimeter of the substrate. Accordingly, in examples including a moveable edge ring, the edge ring may be raised and/or lowered in accordance with the determined plasma sheath profile to further minimize process non-uniformities. Similarly, the plasma sheath profile may be further controlled by varying power provided to a powered edge ring.

Figure 1:
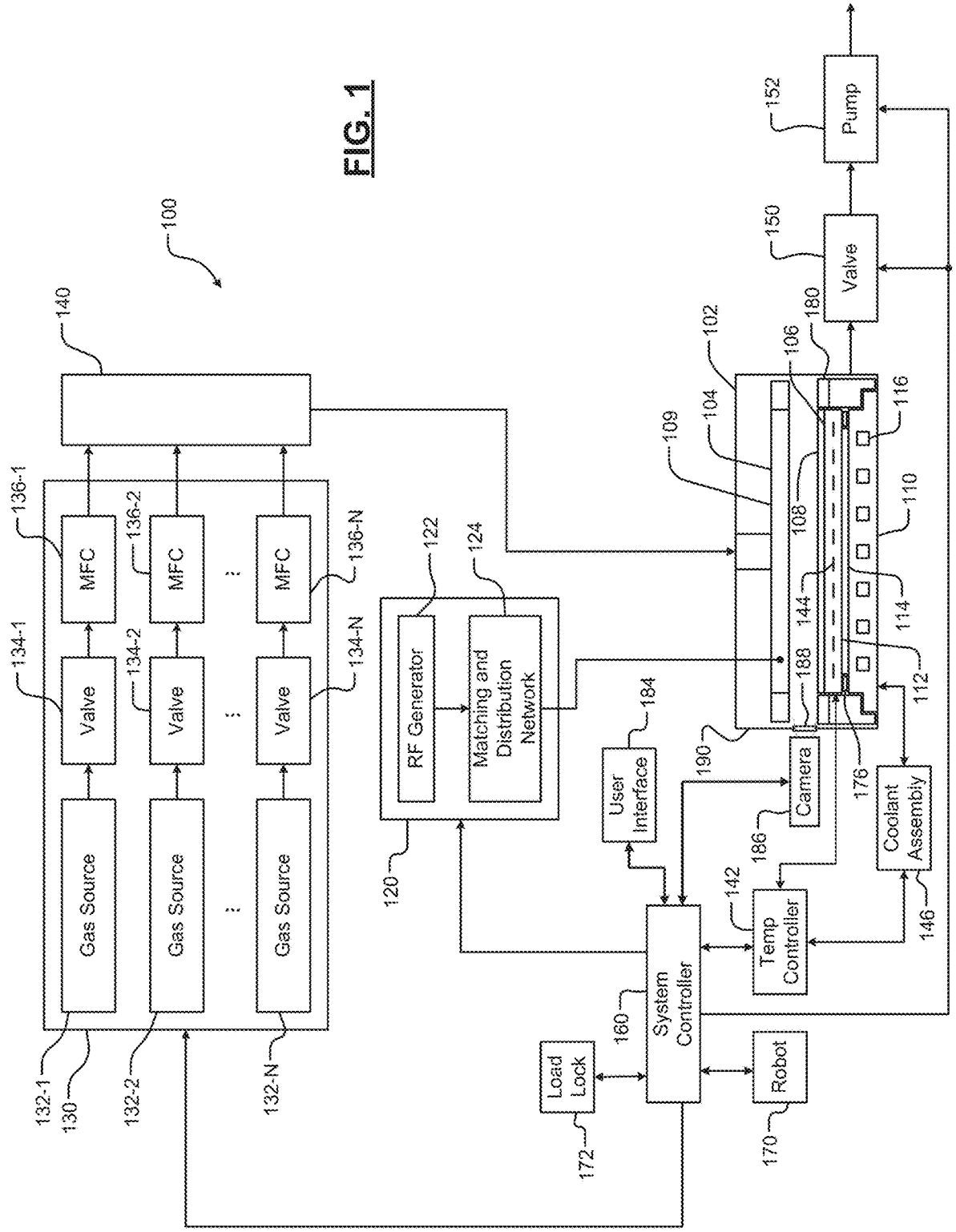
FIG. 1 is a functional block diagram of an example processing chamber according to the present disclosure.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The processing chamber 102 includes an upper electrode 104 and a substrate support 106 including an electrostatic chuck (ESC). During operation, a substrate 108 is arranged on the substrate support 106. While a specific substrate processing system 100 and processing chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber 102. A base portion is generally cylindrical and extends radially outwardly from an opposite end of the stem portion at a location that is spaced from the top surface of the processing chamber 102. A substrate-facing surface or faceplate of the base portion of the showerhead 109 includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110. In some examples, a protective seal 176 may be provided around a perimeter of the bond layer 114 between the ceramic layer 112 and the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more etch gases, carrier gases, inert gases, etc., and mixtures thereof. The gas sources 132 may also supply purge gas. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements 144, such as thermal control elements (TCEs) arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160.

The substrate support 106 includes an edge ring 180. In some examples, the edge ring 180 according to the principles of the present disclosure is moveable (e.g., moveable upward and downward in a vertical direction) relative to the substrate 108. For example, the edge ring 180 may be controlled via an actuator responsive to the system controller 160. In some examples, a user may input control parameters (e.g., erosion rates) to the system controller 160 via a user interface 184, which may include one or more input mechanisms, a display, etc.

An image device such as a camera 186 is arranged to monitor a plasma sheath in the processing chamber 102. For example, the camera 186 is arranged to view the plasma sheath through a window 188 provided in a sidewall 190 of the processing chamber 102. The camera 186 communicates information about the plasma sheath to the system controller 160 as described below in more detail.

Figure 2A:
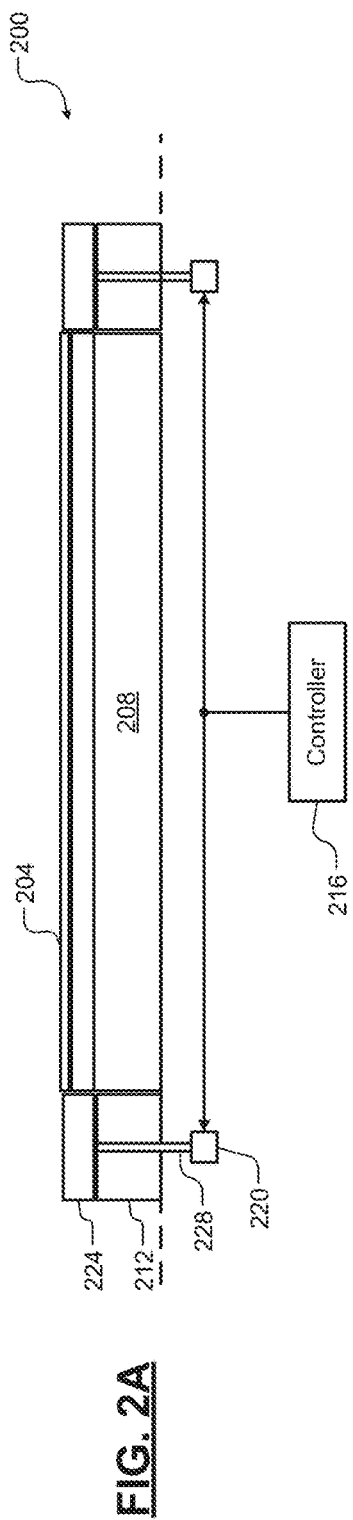
FIG. 2A shows an example movable edge ring in a lowered position according to the present disclosure.
Figure 2B:
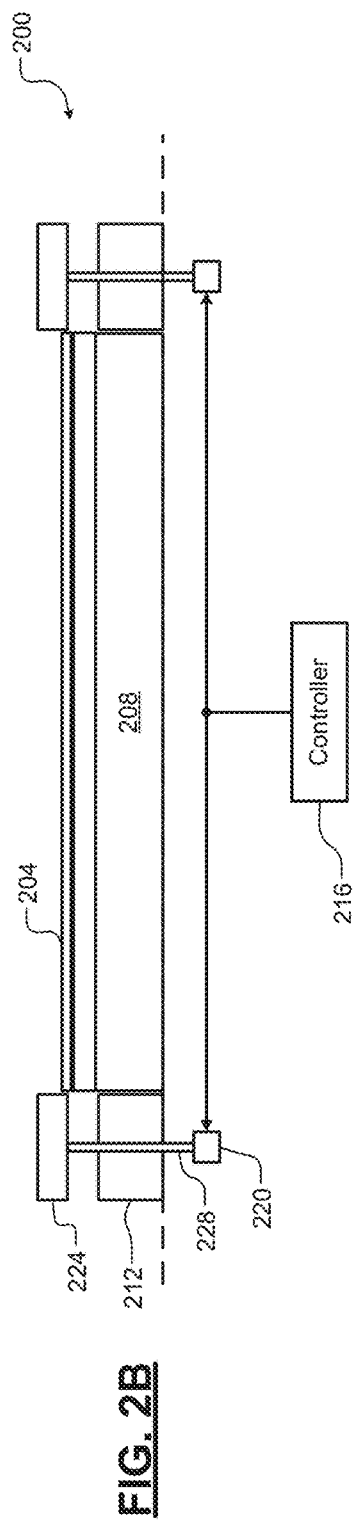
FIG. 2B shows an example movable edge ring in a raised position according to the present disclosure.

In some examples, the principles of the present disclosure may be implemented with a substrate support 200 having a moveable edge ring configuration as shown in FIGS. 2A and 2B. The example substrate support 200 has a substrate 204 arranged thereon. The substrate support 200 may include a base or pedestal having an inner portion (e.g., corresponding to an ESC) 208 and an outer portion 212. In examples, the outer portion 212 may be independent from, and moveable in relation to, the inner portion 208. The substrate 204 is arranged on the inner portion 208 for processing. A controller 216 (e.g., corresponding to the system controller 160) communicates with one or more actuators 220 to selectively raise and lower edge ring 224 to adjust a height of the edge ring 224 relative to the substrate support 200. For example only, the edge ring 224 is shown in a fully lowered position in FIG. 2A and in an example fully raised position in FIG. 2B. As shown, the actuators 220 correspond to pin actuators configured to selectively extend and retract pins 228 in a vertical direction. Other suitable types of actuators may be used in other examples. For example only, the edge ring 224 corresponds to a ceramic or quartz edge ring. In FIG. 2A, the controller 216 communicates with the actuators 220 to directly raise and lower the edge ring 224 via the pins 228. In some examples, the inner portion 208 is moveable relative to the edge ring 224. The edge ring 224 may have one or more associated erosion rates as described below in more detail.

Figure 2C:
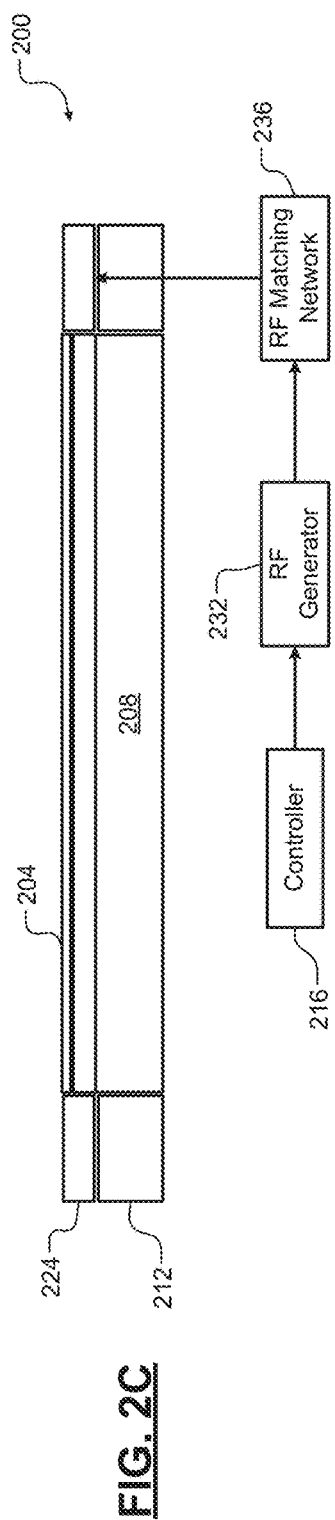
FIG. 2C shows an example powered edge ring according to the present disclosure.

In other examples, the principles of the present disclosure may be implemented with a substrate support 200 having a powered edge ring configuration as shown in FIG. 2C. In this example, the controller 216 is further configured to selectively provide RF power (e.g., via an RF generator 232 and RF matching network 236) to the edge ring 224. In some examples, the edge ring 224 may be both moveable and powered.

Figure 3B:
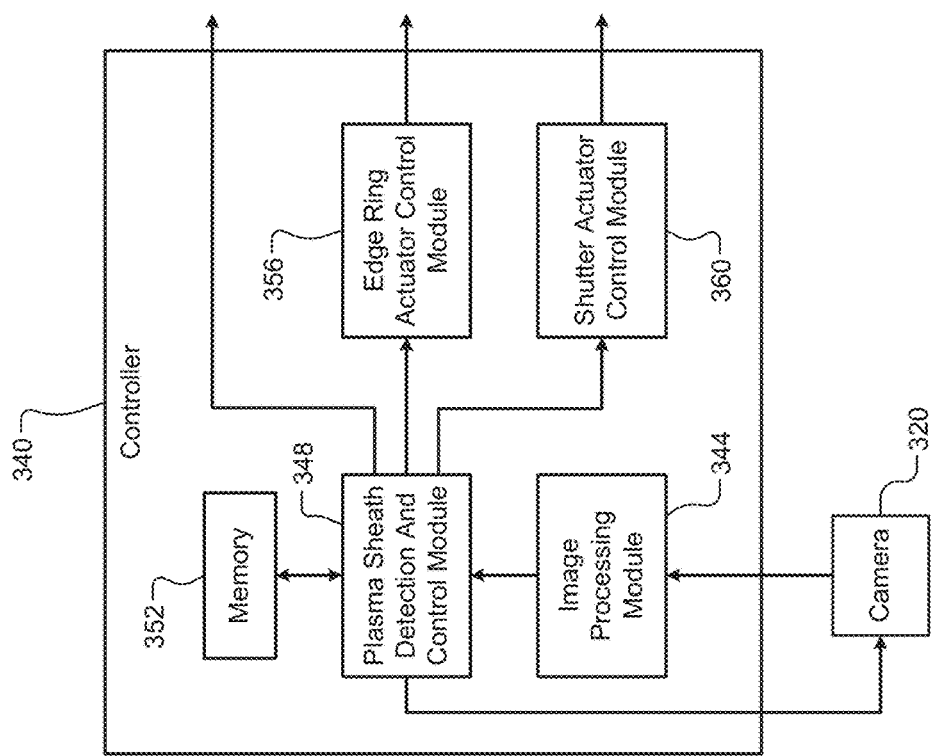
FIG. 3B is a functional block diagram of an example controller according to the present disclosure.
Figure 3A:
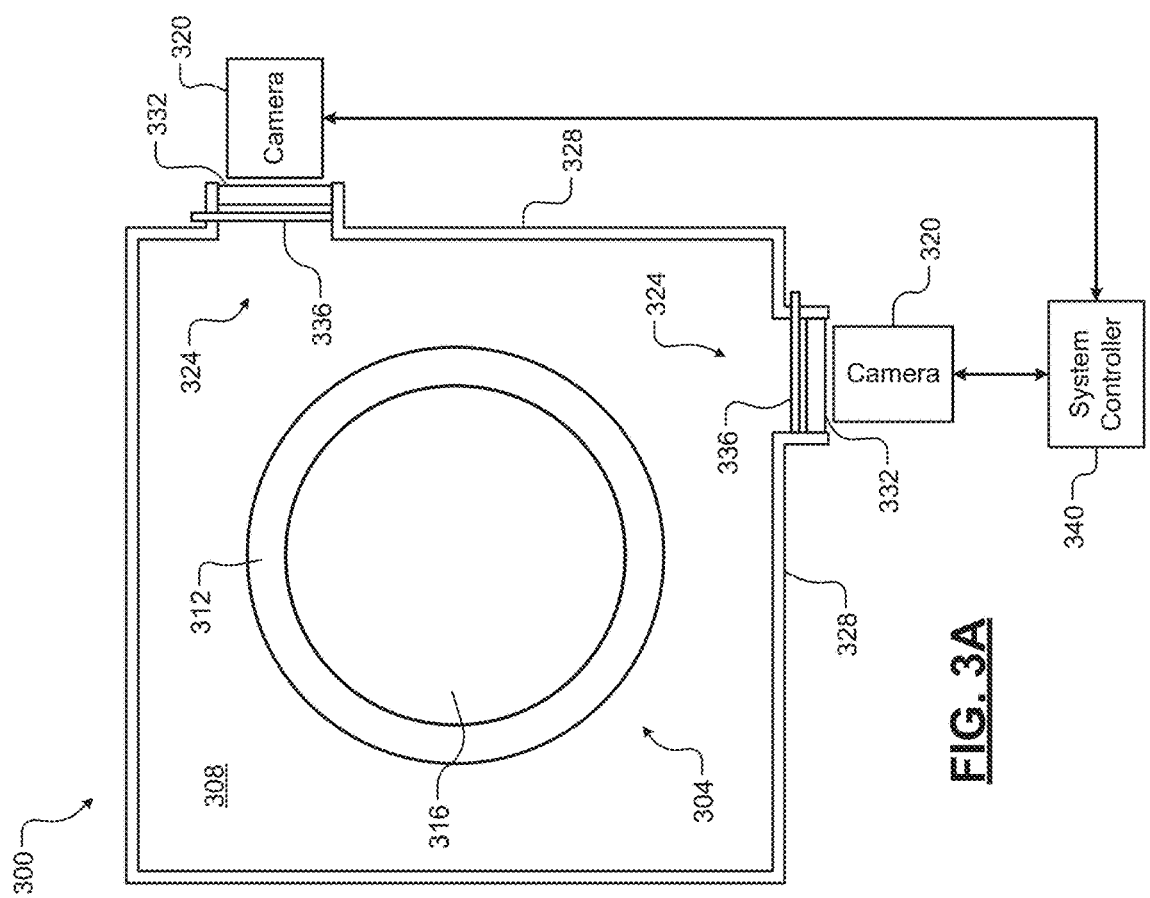
FIG. 3A shows an example processing chamber according to the present disclosure.

Referring now to FIGS. 3A and 3B, an example processing chamber 300 according to the present disclosure is shown. The processing chamber 300 encloses a substrate support 304 within a processing volume 308. As shown, the substrate support 304 includes an edge ring 312 arranged to surround a substrate 316 arranged on the substrate support 304. In some examples, the edge ring 312 may be configured to be raised and lowered as described above in FIGS. 2A and 2B.

One or more cameras 320 (e.g., high resolution digital cameras) are arranged to monitor the processing volume 308 above the substrate 316. Although two of the cameras 320 are shown arranged to image a portion of the processing volume 308 above edge regions of the substrate 316, one or more than two cameras 320 may be provided. For example, plasma sheath bending may be more likely to occur at edges of the substrate 316. Accordingly, the location and viewing angle of the cameras 320 are selected to maximize coverage of edges of the substrate 316 to detect the plasma sheath bending. Further, although the cameras 320 are shown aligned with edge regions of the substrate 316 in FIG. 3A, in other examples, the cameras 320 may be arranged in different locations (e.g., centered relative to the substrate 316) to monitor the entire processing volume 308 above the substrate 316.

The cameras 320 are arranged to view the processing volume 308 through openings 324 in sidewalls 328 of the processing chamber 300. For example, the cameras 320 are arranged to view the processing volume 308 through windows 332 arranged in the openings 324. The windows 332 may be comprised of glass or another suitable transparent material and are vacuum sealed.

The windows 332 may be susceptible to wear and/or damage from exposure to plasma and other materials within the processing chamber 300. Accordingly, plasma resistant mechanical doors or shutters 336 may be provided to protect the windows 332 from the environment within the processing chamber 300. For example, the shutters 336 may comprise the same material as the sidewalls 328 of the processing chamber 300. The shutters 336 may be configured to be selectively opened to allow the cameras 320 to capture images of the processing volume 308 and closed to protect the windows 332 from the plasma environment to prolong a usable lifetime of the windows 332. For example, the shutters 336 may be selectively actuated in response to control signals from a controller 340 (which may correspond to the system controller 160). In some examples, the shutters 336 correspond to gate valves, such as vacuum gate valves.

The cameras 320 are configured to selectively capture images of the processing volume 308 via the windows 332 (e.g., in response to control signals received from the controller 340) and the controller 340 is configured to detect the plasma sheath based on the captured images, determine a plasma sheath profile, adjust process parameters based on the plasma sheath profile, etc. Differences between characteristics (e.g., electron temperature, ion density, etc.) of bulk plasma within the processing volume 308 and in a plasma sheath region adjacent to the substrate 316 are detectable based on the captured images and the plasma sheath may be identified accordingly. For example, due to differences between various characteristics, visible light and ultraviolet emission in the plasma sheath region may differ relative to the bulk plasma and therefore may be distinguished (i.e., contrasted) in the captured images. In this manner, the controller 340 is configured to extract features from the captured images that are indicative of the plasma sheath, and may selectively adjust process parameters (e.g., edge ring height, plasma density profile, power delivered to upper and/or lower electrodes, process gas flow rates, side gas tuning, coil tuning, etc.) based on the detected plasma sheath. In some examples, the cameras 320 may implement one or more optical filters to enhance contrast between the bulk plasma and the plasma sheath region.

As shown in FIG. 3B, the controller 340 includes an image processing module 344 configured to extract features of the images captured by the camera 320 that may be indicative of the plasma sheath. Although shown within the controller 340, in some examples the cameras 320 may include the image processing module 344. For example only, the image processing module 344 is configured to identify a line in the captured images indicating a contrast between the bulk plasma and the plasma sheath region as described below in more detail. In some examples, the image processing module 344 may filter the captured images, perform post-processing on the captured images to enhance the contrast between the bulk plasma and the plasma sheath region, etc.

A plasma sheath detection and control module 348 receives the extracted features from the image processing module 344. In other features, the plasma sheath detection and control module 348 may receive the captured image directly from the cameras 320 and/or receive the captured images from the image processing module 344 subsequent to post-processing. In other words, the plasma sheath detection and control module 348 may be configured to receive the extracted features and/or perform the feature extraction on the captured images. For example, the plasma sheath detection and control module 348 may perform feature extraction in accordance with image processing algorithms stored in memory 352.

The plasma sheath detection and control module 348 determines the plasma sheath profile based on the extracted features and selectively adjusts one or more process parameters based on the plasma sheath profile. For example, the plasma sheath detection and control module 348 may adjust the process parameters in accordance with a flatness of the plasma sheath profile. In some examples, the plasma sheath detection and control module 348 compares the plasma sheath profile with a predetermined reference profile, such as a reference line (e.g., a flat line located at a predetermined distance above the substrate surface) and determines whether a difference between the plasma sheath profile and the reference line is greater than a threshold. For example, the plasma sheath detection and control module 348 may calculate a distance between the plasma sheath profile and the reference line at an edge of the substrate, a maximum variance between the plasma sheath profile and the reference line, etc.

In one example, the plasma sheath detection and control module 348 selectively raises or lowers the edge ring 312 to adjust the plasma sheath profile (e.g., using an edge ring actuator control module 356). For example, the plasma sheath detection and control module 348 is configured to raise or lower the edge ring 312 based on the determined flatness of the plasma sheath profile, control the cameras 320 to capture additional images of the plasma sheath, and determine the flatness of the plasma sheath profile with the edge ring 312 in the adjusted position until a desired flatness of the plasma sheath profile is achieved (e.g., a difference between the reference line and the plasma sheath profile is less than a threshold). The plasma sheath detection and control module 348 may adjust other process parameters as described above (e.g., plasma density profile, power delivered to upper and/or lower electrodes, process gas flow rates, side gas tuning, coil tuning, etc.). For example, the plasma sheath detection and control module 348 may control the RF generator 232 to adjust (e.g., increase or decrease) RF power provided to the edge ring 312 to adjust a thickness of the plasma sheath above an edge region of the substrate 316.

The plasma sheath detection and control module 348 is further configured to control a shutter actuator control module 360 to selectively open and close the shutters 336. For example, plasma sheath detection and control module 348 selectively opens the shutters 336 to allow the cameras 320 to capture images of the processing volume 308 and then closes the shutters 336 to protect the windows 332 from the plasma environment. Accordingly, the shutters 336 may be opened only briefly (e.g., less than one second) for image capture. The shutters 336 may be opened for image capture to adjust the plasma sheath profile periodically (e.g., weekly or monthly, subsequent to processing a predetermined number of substrates, etc.), in response to user input, periodically during the processing of a single substrate (e.g., at one minute intervals), etc.

Referring now to FIG. 4A, example images 400 and 404 of a plasma sheath as captured by a camera (e.g., the cameras 320) are shown. As shown in the image 400, a plasma sheath profile 408 bends downward toward an edge 412 of a substrate 416. In other examples, the plasma sheath profile 408 may bend upward away from the edge 412 of the substrate 416. Bending downward or upward may indicate that the edge ring is too low or too high relative to the substrate 416, respectively. Conversely, as shown in the image 404, the plasma sheath profile 408 is relatively flat. For example, the image 404 may correspond to an image captured subsequent to adjusting a height of the edge ring or other process parameters to adjust the plasma sheath profile 408.

FIGS. 4B and 4C show example features (e.g., lines 420 and 424) extracted from captured images of the plasma sheath. Reference, the extracted features are shown with respect to outer portions of a substrate support 428. As shown in FIG. 4B, the line 420 corresponding to the determined plasma sheath profile bends downward toward the outer edge 412 of the substrate 416. Conversely, as shown in FIG. 4C, the line 424 is relatively flat as compared to the line 420 and does not bend downward. For example, the line 424 may correspond to the plasma sheath profile subsequent to edge ring 432 being raised to adjust the plasma sheath profile. In this example, the edge ring 432 may be adjusted in accordance with a comparison between the lines 420 and 424 and a reference line 436 as described above.

Figure 5:
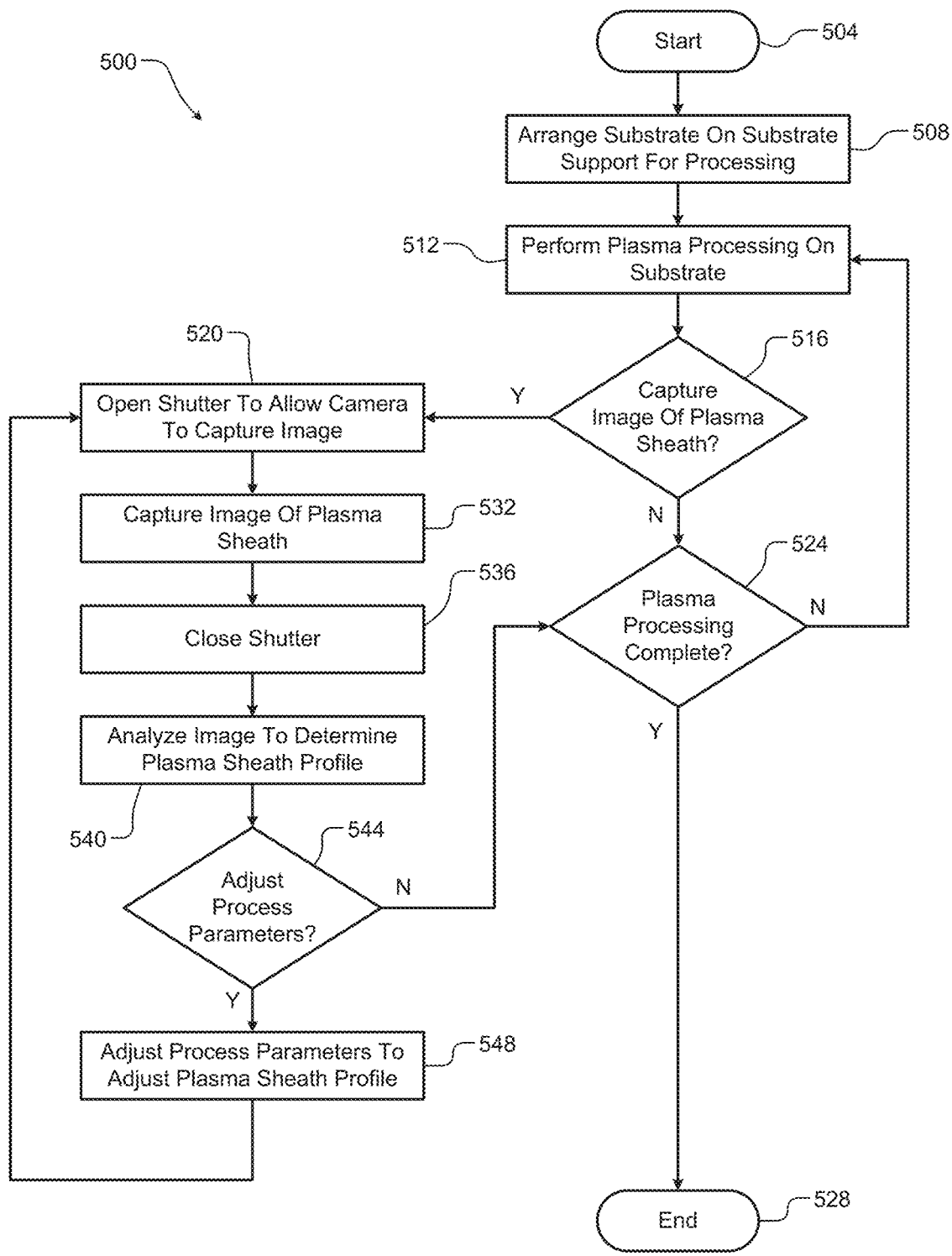
FIG. 5 shows an example method for determining a plasma sheath profile according to the present disclosure.

Referring now to FIG. 5, an example method 500 for determining a plasma sheath profile according to the present disclosure begins at 504. At 508, a substrate is arranged on a substrate support in a processing chamber. At 512, plasma processing (e.g., a plasma etch step) is performed on the substrate. At 516, the method 500 (e.g., the controller 340) determines whether to capture an image of a plasma sheath within the processing chamber. If true, the method 500 continues to 520. If false, the method 500 continues to 524. At 524, the method (e.g., the controller 340) determines whether the plasma processing is complete. If true, the method 500 ends at 528. If false, the method 500 continues to 512.

At 520, the method 500 (e.g., the controller 340) opens a shutter (e.g., one or more of the shutters 336) to allow an image of the plasma sheath to be captured through an opening in a sidewall of the processing chamber. At 532, the method 500 (e.g., the camera 320) captures an image of the plasma sheath. At 536, the method 500 (e.g., the controller 340) closes the shutter. At 540, the method 500 (e.g., the controller 340) analyzes the captured image to determine the plasma sheath profile. For example, the method 500 determines a flatness of the plasma sheath profile. At 544, the method 500 (e.g., the controller 340) determines whether to adjust one or more process parameters (e.g., an edge ring height, RF power provided to the edge ring, etc.) in accordance with the determined flatness of the plasma sheath profile. If true, the method 500 continues to 548. If false, the method 500 continues to 524.

At 548, the method 500 (e.g., the controller 340) adjusts one or more process parameters to adjust the plasma sheath profile. For example, the method 500 adjusts the edge ring height. The method 500 then continues to 520 to repeat steps 520, 532, 536, 540, and 544. In other words, subsequent to adjusting the edge ring height, the method 500 captures another image of the plasma sheath to determine whether to further adjust the edge ring height to achieve a desired flatness of the plasma sheath profile.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A plasma processing system, comprising:
    an image processor configured to (i) receive an image, captured by a camera, of a plasma environment within a substrate processing chamber during processing of a substrate and (ii) extract one or more features of the image indicative of a plasma sheath formed within the plasma environment during the processing of the substrate; and
    a controller including a processor and configured to (i) determine a plasma sheath profile of the plasma sheath formed within the plasma environment based on the one or more features extracted from the image and (ii) selectively adjust a height of an edge ring based on a difference between the plasma sheath profile as determined by the controller and a reference profile.

2. The plasma processing system of claim 1, wherein one of the one or more features corresponds to a contrast between a bulk plasma region and a plasma sheath region.

3. The plasma processing system of claim 2, wherein the one of the one or more features corresponds to a line between the bulk plasma region and the plasma sheath region.

4. The plasma processing system of claim 1, wherein the controller is configured to (i) compare the plasma sheath profile to the reference profile and (ii) selectively adjust the height of the edge ring based on a difference between the plasma sheath profile and a reference line corresponding to the reference profile.

5. The plasma processing system of claim 4, wherein the reference line is a flat line located a predetermined distance above the substrate.

6. The plasma processing system of claim 1, wherein the controller is configured to determine a flatness of the plasma sheath profile to selectively adjust the height of the edge ring.

7. The plasma processing system of claim 1, wherein (i) the at least one processing parameter corresponds to power provided to an edge ring and (ii) the controller is configured to adjust the power provided to the edge ring based on the one or more features extracted from the image.

8. The plasma processing system of claim 1, wherein the camera is arranged to view the plasma environment above an edge region of the substrate through an opening in a sidewall of the substrate processing chamber.

9. The plasma processing system of claim 8, further comprising a shutter arranged to selectively open and close within the opening in the sidewall of the substrate processing chamber.

10. The plasma processing system of claim 9, wherein the controller is configured to selectively open and close the shutter to allow the camera to capture the image.

* * * * *